United States Patent [19]
Matsumoto et al.

[11] Patent Number: 5,966,088
[45] Date of Patent: Oct. 12, 1999

[54] ANALOG/DIGITAL CONVERTER AND VOLTAGE COMPARATOR CAPABLE OF FAST PRODUCING OF OUTPUT OFFSET VOLTAGE

[75] Inventors: Osamu Matsumoto; Toshio Kumamoto, both of Hyogo, Japan

[73] Assignee: Mitsubishi Denki Kabushiki Kaisha, Tokyo, Japan

[21] Appl. No.: 08/982,279

[22] Filed: Dec. 1, 1997

[30] Foreign Application Priority Data

May 23, 1997 [JP] Japan .................................. 9-133682

[51] Int. Cl.⁶ .................................................. H03M 1/10
[52] U.S. Cl. ......................... 341/156; 341/122; 341/118; 341/161; 327/96
[58] Field of Search ............................. 327/96; 341/118, 341/120, 122, 156, 161, 162, 163

[56] References Cited

U.S. PATENT DOCUMENTS

| | | | |
|---|---|---|---|
| 4,587,443 | 5/1986 | van de Plassche | 327/96 |
| 5,047,727 | 9/1991 | Theus | 327/91 |
| 5,391,999 | 2/1995 | Early et al. | 327/337 |
| 5,497,120 | 3/1996 | Ito et al. | 327/563 |
| 5,594,445 | 1/1997 | Ginetti | 341/162 |
| 5,894,284 | 4/1999 | Garrity et al. | 341/172 |

FOREIGN PATENT DOCUMENTS 1-259628 10/1989 Japan .
3-089610 4/1991 Japan .

OTHER PUBLICATIONS

"A 10–bit 50MS/s 300mW A/D Converter using Reference Feed–Forward Architecture", Kumamoto et al., ESS-CIRC'96, pp. 220–223.

*Primary Examiner*—Howard L. Williams
*Attorney, Agent, or Firm*—McDermott, Will & Emery

[57] ABSTRACT

An A/D converter includes a sample-hold circuit, A/D converting stages connected in series to the sample-hold circuit, and an encoder/latch circuit which adds 3-bit digital signals issued from the A/D converting stages to each other for outputting a signal of 9 bits. The sample-hold circuit and the A/D converting stages each include a differential amplifier. Differential outputs of each differential amplifier are short-circuited for a predetermined initial period in each sampling period.

11 Claims, 14 Drawing Sheets

FIG. 4
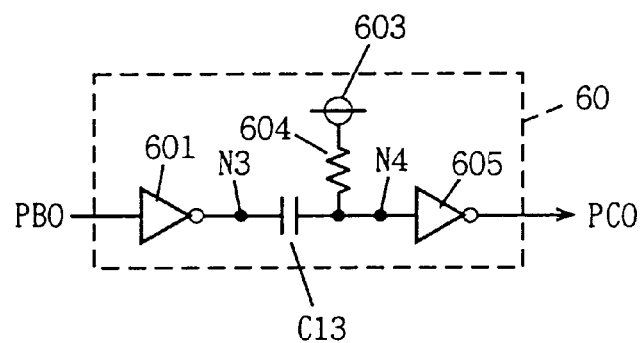
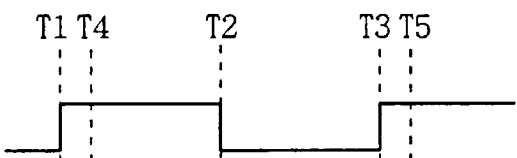
FIG. 5A  PB0
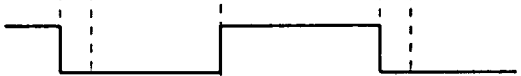
FIG. 5B  N3
FIG. 5C  N4
FIG. 5D  PC0

ANALOG/DIGITAL CONVERTER AND VOLTAGE COMPARATOR CAPABLE OF FAST PRODUCING OF OUTPUT OFFSET VOLTAGE

BACKGROUND OF THE INVENTION

1. Field of the Invention

The present invention relates to an analog/digital (which will be referred also to as "A/D") converter for converting an analog signal to a digital signal.

2. Description of the Background Art

FIG. 13 shows a structure of a pipeline A/D converter in the prior art. As shown in FIG. 13, the pipeline A/D converter includes a sample-hold circuit 2 for sampling and holding an input voltage, A/D sub-converters 4, 11, 13 and 15 connected in series to sample-hold circuit 2, and a digital circuit 1 connected to each of A/D sub-converters 4, 11, 13 and 15.

Each of A/D sub-converters 4, 11 and 13 includes a flash A/D converter 5 which converts an input analog voltage into a digital signal for outputting the same to digital circuit 1, a digital/analog (which will be referred to also as "D/A") converter 7 which outputs an analog voltage corresponding to the input digital signal, and a subtracter 9 which subtracts the output voltage of D/A converter 7 from the analog voltage supplied to the A/D sub-converter and outputs the result of subtraction after amplifying the same.

A/D sub-converter 15 at the final stage includes a flash A/D converter 16.

FIG. 14 shows specific structures of sample-hold circuit 2 and A/D sub-converter 4 shown in FIG. 13. As shown in FIG. 14, sample-hold circuit 2 includes switches S0, S0A and S0B, a capacitor C0 and an amplifier 3. A/D sub-converter 4 includes a switch S1, a flash A/D converter 5, a D/A converter 7, capacitors C1A and C1B, and an amplifier 8.

Switches S0 and S0A are turned on in response to activation of signal $\phi$, and switches S0B and S1 are turned on in response to activation of a signal $/\phi$.

An operation of the circuit shown in FIG. 14 will be described below with reference to timing charts of FIGS. 15A and 15B.

Signal $\phi$ periodically attains a high level (H-level) and a low level (L-level) as shown in FIG. 15B.

In a sample period during which signal $\phi$ is at H-level, switches S0 and S0A are turned on, and a voltage VB is applied to an input terminal of amplifier 3, so that an output offset voltage shown by solid line in FIG. 15A is supplied to an output node N0 of amplifier 3. This output offset voltage is applied to capacitor C1B.

In this sample period, voltages VIN and VB are applied to input and output terminals of capacitor C0, respectively, and voltage VIN is sampled.

In the hold period during which signal $\phi$ is at L-level, switches S0 and S0A are off, switch S0B is on, and capacitor C0 is supplied on its input terminal with voltage VB, so that the operation is in such a hold state that the amplifier 3 is supplied on its input terminal with a voltage Vx (=−VIN+2VB). In this state, amplifier 3 applies to output node N0 a signal voltage including an output offset voltage $V_{offset}$ as indicated by solid line in FIG. 15A.

As described above and represented by solid line in FIG. 15A, amplifier 3 alternately outputs the signal voltage containing the output offset voltage and the signal voltage containing output offset voltage $V_{offset}$, which are applied to capacitor C1B. Thereby, capacitor C1B subtracts output offset voltage $V_{offset}$ from the signal voltage, and an offset-canceled and therefore true signal voltage is obtained.

FIG. 16 shows a structure of a voltage comparator included in flash A/D converter 5. As shown in FIG. 16, this voltage comparator includes two input terminals 18, capacitors C2A, C2B and C, switches S2 and S3, amplifiers 17 and 19, and a latch circuit 21.

Here, one of input terminals 18 is connected to sample-hold circuit 2 and output node N0, and the other is supplied with a reference voltage for comparison.

Similarly to amplifier 3 included in the aforementioned sample-hold circuit 2, amplifiers 17 and 19 included in this voltage comparator alternately issue output offset voltages and voltages representing results of comparison, and capacitor C performs offset canceling.

Sample/hold circuit 2 and subtracter 9 included in the pipeline A/D converter in the prior art shown in FIG. 13 produce an offset voltage $V_{offset}$ in the sample period based on an initial value which is a value of a voltage amplified in the last hold period. Therefore, a certain time is unpreferably required before output offset voltage $V_{offset}$ is produced.

Likewise, the voltage comparator in the prior art produces an output offset voltage in the sample period based on an initial value which is a value of a voltage amplified in the last hold period and representing the result of comparison.

SUMMARY OF THE INVENTION

An object of the invention is to provide an A/D converter, which can perform fast production of an output offset voltage by a sample/hold circuit 2 and a subtracter 9 as represented by broken line in FIG. 15A.

Another object of the invention is to provide a voltage comparator which can perform fast production of an output offset voltage.

According to an aspect of the invention, an A/D converter includes a sample-hold circuit for sampling first analog data for a first period and holding the same for a second period; a plurality of analog/digital converting stages connected in series to the sample-hold circuit; and a latch circuit for latching digital data output from each of the analog/digital converting stages, wherein the analog/digital converting stage includes an analog/digital converter circuit for converting second analog data supplied from the sample-hold circuit into digital data and outputting the same to the latch circuit, a digital/analog converter circuit connected to the analog/digital converting circuit for converting the digital data into third analog data, a subtracter for subtracting the third analog data from the second analog data and thereby outputting result data of the subtraction, a first amplifier connected to the subtracter for receiving a first bias voltage for the second period and amplifying the result data of the subtraction supplied from the subtracter for the first period, and a first voltage supply circuit for supplying a first auto-zero voltage to an output terminal of the first amplifier only for a predetermined initial period in the second period.

According to another aspect of the invention, a voltage comparator for receiving data for a data receiving period and comparing the data with a reference voltage to output a result of the comparison for a data comparing period, includes an amplifier for comparing the data with the reference voltage and amplifying the result of the comparison, and a voltage supply circuit for supplying an auto-zero voltage to an output terminal of the amplifier only for a predetermined initial period in the data receiving period.

Accordingly, the invention has such a major advantage that the output offset voltage of the first amplifier included in the A/D converting stage can be obtained fast.

As another advantage, the invention can provide a voltage comparator in which an amplifier can produce an output offset voltage at an increased speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing a structure of an auto-zero voltage supply signal producing circuit;

FIGS. 5A to 5D are timing charts showing an operation of the circuit shown in FIG. 4;

DESCRIPTION OF THE PREFERRED EMBODIMENTS

Figure 1:
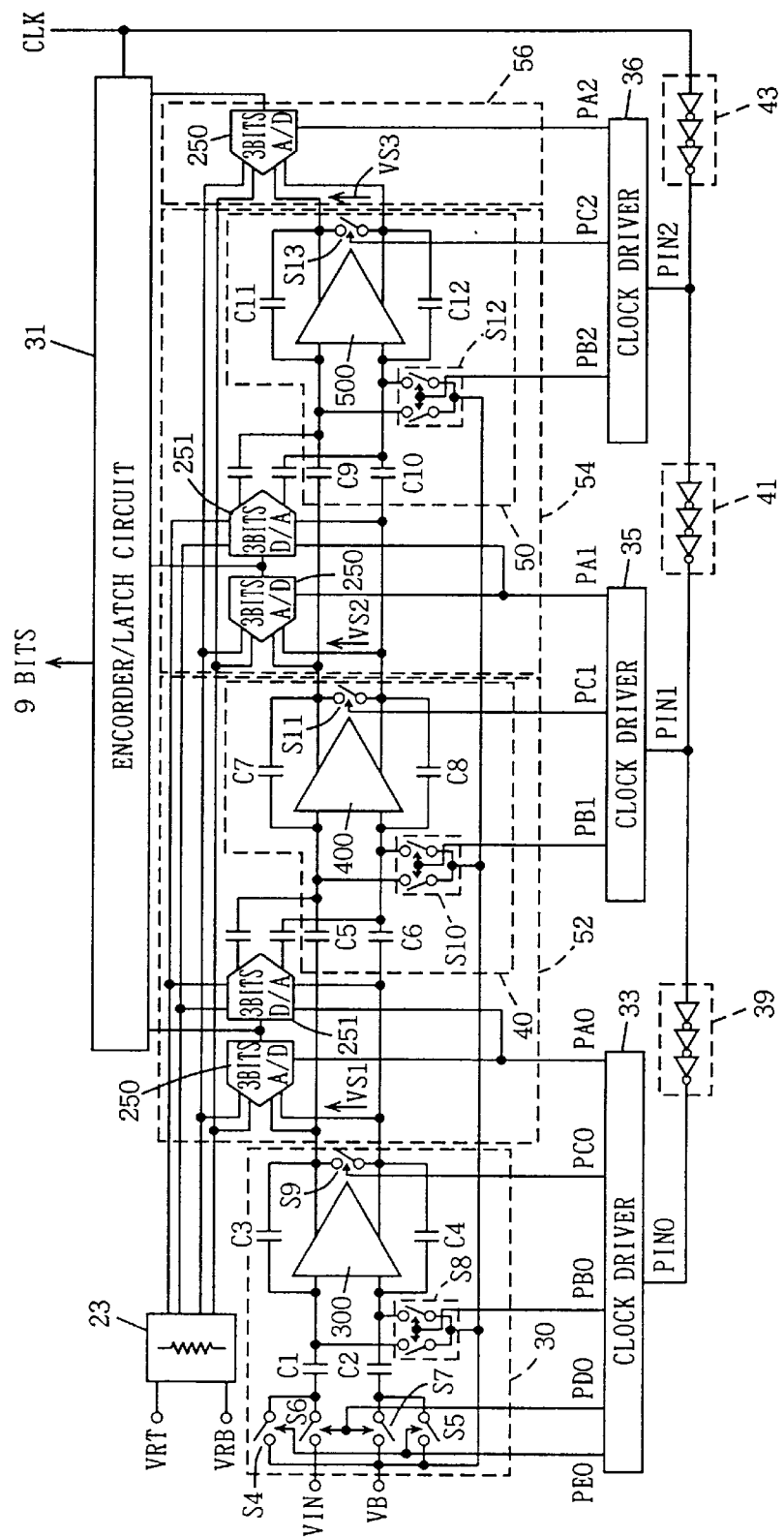
FIG. 1 shows a whole structure of an A/D converter of an embodiment 1 of the invention.

Embodiments of the invention will be described below with reference to the drawings. In the figures, the same or corresponding parts and portions bear the same reference characters.

[Embodiment 1]

FIG. 1 shows a whole structure of an A/D converter of a differential pipeline type of an embodiment 1 of the invention. As shown in FIG. 1, the A/D converter includes a sample-hold circuit 30 which receives an input signal VIN and holds the same for a predetermined period, A/D converting stages 52, 54 and 56 connected in series to sample-hold circuit 30, an encoder/latch circuit 31 which adds 3-bit digital data sent from A/D converting stages 52, 54 and 56 to each other and thereby outputs digital data of 9 bits, clock drivers 33, 35 and 36 for supplying control signals PA0, PB0, PC0, PD0, PE0, PA1, PB1, PC1, PA2, PB2 and PC2, which are produced in response to a clock signal CLK, to sample-hold circuit 30 and A/D converting stages 52, 54 and 56, and a ladder resistor 23 for supplying a reference voltage to A/D converting stages 52, 54 and 56.

Sample-hold circuit 30 includes capacitors C1–C4, an amplifier 300, switches S4 and S5 for supplying a bias voltage VB to capacitors C1 and C2 in response to control signal PD0, a switch S6 for supplying input signal VIN to capacitor C1 in response to control signal PE0, a switch S7 for supplying bias voltage VB to capacitor C2 in response to the same control signal PE0, a switch S8 for supplying a bias voltage VB to differential input terminals of amplifier 300 in response to control signal PB0, and a switch S9 for short-circuiting differential output terminals of amplifier 300 in response to control signal PC0.

A/D converting stage 52 includes a flash 3-bit A/D converter 250 which receives a differential voltage VS1 from amplifier 300 and converts the same into a digital signal, a 3-bit D/A converter 251 which is connected to flash 3-bit A/D converter 250 for outputting an analog voltage depending on the received digital signal, and a subtracter circuit 40.

Subtracter circuit 40 includes capacitors C5–C8, an amplifier 400, a switch S10 for supplying bias voltage VB to differential input terminals of amplifier 400 in response to control signal PB1, and a switch S11 for short-circuiting differential output terminals of amplifier 400 in response to control signal PC1.

A/D converting stage 54 has a structure similar to A/D converting stage 52. Flash 3-bit A/D converter 250 included in A/D converting stage 54 receives a differential voltage VS2 of amplifier 400.

A/D converting stage 56 includes flash 3-bit A/D converter 250. Flash 3-bit A/D converter 250 receives a differential voltage VS3 of amplifier 500 included in A/D converting stage 54.

Figure 2:
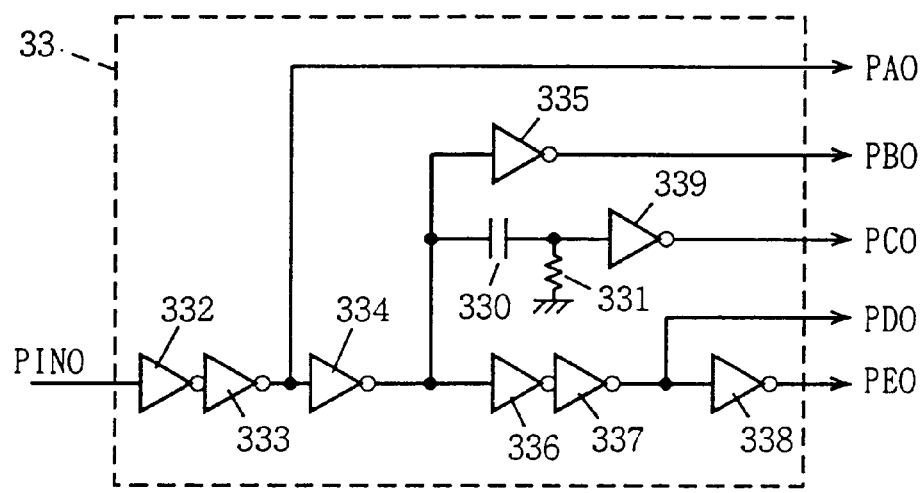
FIG. 2 is a circuit diagram showing a structure of a clock driver shown in FIG. 1.

FIG. 2 is a circuit diagram showing a specific structure of a clock driver 33 shown in FIG. 1. As shown in FIG. 2, clock driver 33 includes inverters 332–338, a capacitor 330 having nodes one of which is connected to an output terminal of inverter 334, a resistor element connected between the other node of capacitor 330 and a ground node, and an inverter 339 connected to the other node of capacitor 330.

Clock drivers 35 and 36 have structures similar to that of clock driver 33 shown in FIG. 2 except for that they do not include inverters 336–338.

This A/D converter is provided with delay circuits 39, 41 and 43 including three inverters. Delay circuit 43 delays input clock signal CLK to issue a signal PIN2 of an opposite phase to clock driver 36. Delay circuit 41 delays signal PIN2 to issue a signal PIN1 of an opposite phase to clock driver 35. Delay circuit 39 delays signal PIN1 to issue a signal PIN0 to clock driver 33.

Control signal PC0 can be produced, as shown in FIG. 4, based on control signal PB0 by an auto-zero voltage supply signal producing circuit 60. Auto-zero voltage supply signal generating circuit 60 includes an inverter 601 supplied with control signal PB0, a capacitor C13 connected at one of its nodes to an output node N3 of inverter 601, a power supply node 603, a resistor element 604 connected between power supply node 603 and the other node of capacitor C13, and an inverter 605 connected to the other node of capacitor C13.

FIGS. 5A–5D are timing charts showing an operation of auto-zero voltage supply signal producing circuit 60 shown in FIG. 4. FIG. 5A shows a waveform of input signal PB0, FIGS. 5B and 5C show signal waveforms at nodes N3 and N4, respectively, and FIG. 5D shows a waveform of output control signal PC0. As shown in FIGS. 5A–5D, auto-zero voltage supply signal producing circuit 60 having the above structure can likewise produce control signal PC0 which is at H-level only during an initial period from T1 to T4 in a period from T1 to T2, during which control signal PB0 is at H-level.

Figure 6:
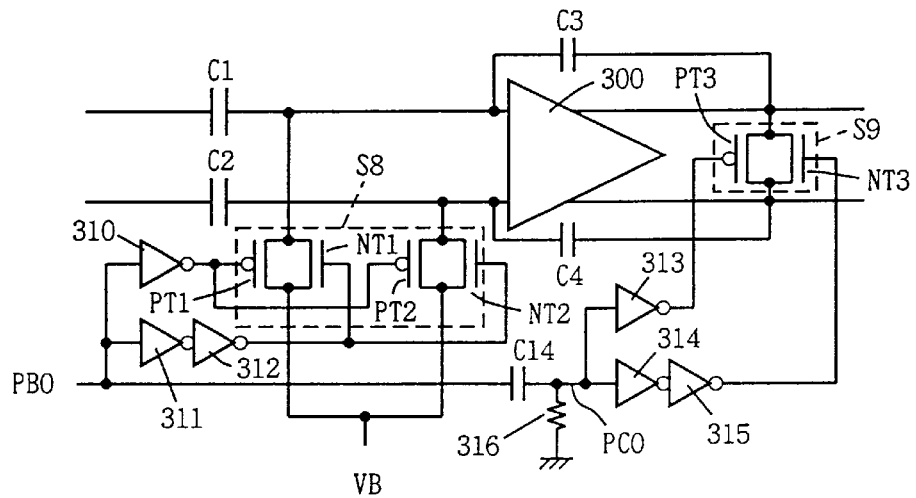
FIG. 6 is a circuit diagram showing an example of a sample-hold circuit shown in FIG. 1.

FIG. 6 is a circuit diagram showing an example of specific structures of switches S8 and S9 included in sample-hold circuit 30. As shown in FIG. 6, switch S8 includes P-channel MOS transistors PT1 and PT2, and N-channel MOS transistors NT1 and NT2. Switch S9 includes P-channel MOS transistor PT3 and N-channel MOS transistor NT3.

Control signal PB0 is supplied to gates of P-channel MOS transistors PT1 and PT2 through one inverter 310, and is also supplied to a gate of P-channel MOS transistor PT3 through one inverter 313. Control signal PB0 is also supplied to gates of N-channel MOS transistors NT1 and NT2 through two inverters 311 and 312, and is also supplied to a gate of N-channel MOS transistor NT3 through two internal inverters 314 and 315.

According to the structure described above, the switches S8 and S9 are switched at the same timing, and bias voltage VB is supplied to differential input terminals of amplifier 300 simultaneously with short-circuiting of the differential output terminals of amplifier 300.

Figure 7:
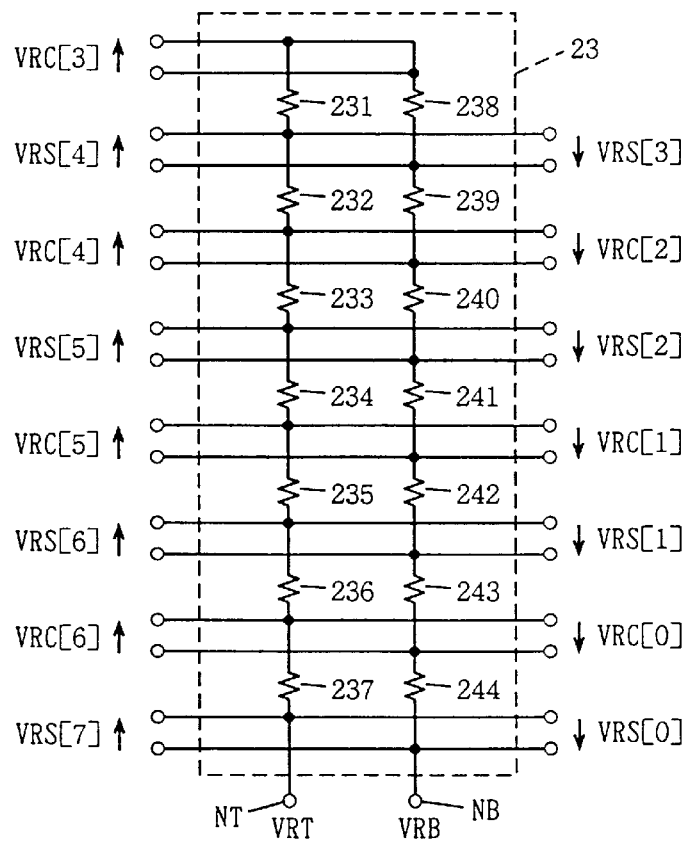
FIG. 7 is a circuit diagram showing a structure of a ladder resistor shown in FIG. 1.

FIG. 7 is a circuit diagram showing a specific structure of ladder resistor 23 shown in FIG. 1. Voltages VRT and VRB represent the maximum and minimum values of the reference voltage of this A/D converter, respectively.

As shown in FIG. 7, a ladder resistor 23 includes 14 resistors 231–244 which have equal resistance values and are connected in series between node NT supplied with voltage VRT and node NB supplied with voltage VRB.

Ladder resistor 23 supplies reference voltages VRC[0]–VRC[6] for comparison to A/D converters 250 included in A/D converters 52, 54 and 56, and also supplies reference voltages VRS[0]–VRS[7] for subtraction to 3-bit D/A converters 251 included in A/D converting stages 52 and 54. Reference voltages VRC[0]–VRC[6] and VRS[0]–VRS[7] for comparison and subtraction are supplies as differential voltages.

More specifically, reference voltages for comparison satisfy relationships of VRC[0]=−(6/7)×(VRT−VRB), VRC[1]=−(4/7)×(VRT−VRB), VRC[2]=−(2/7)×(VRT−VRB), VRC[3]=0, VRC[4]=(2/7)×(VRT−VBR), VRC[5]=(4/7)×(VRT−VRB) and VRC[6]=(6/7)×(VRT−VRB). Reference voltages for subtraction satisfy relationships of VRS[0]=−(VRT−VRB), VRS[1]=−(5/7)×(VRT−VRB), VRS[2]=−(3/7)×(VRT−VRB), VRS[3]=−(1/7)×(VRT−VRB), VRS[4]=(1/7)×(VRT−VBR), VRS[5]=(3/7)×(VRT−VRB), VRS[6]=(5/7)×(VRT−VRB) and VRS[7]=(VRT−VRB).

Figure 8:
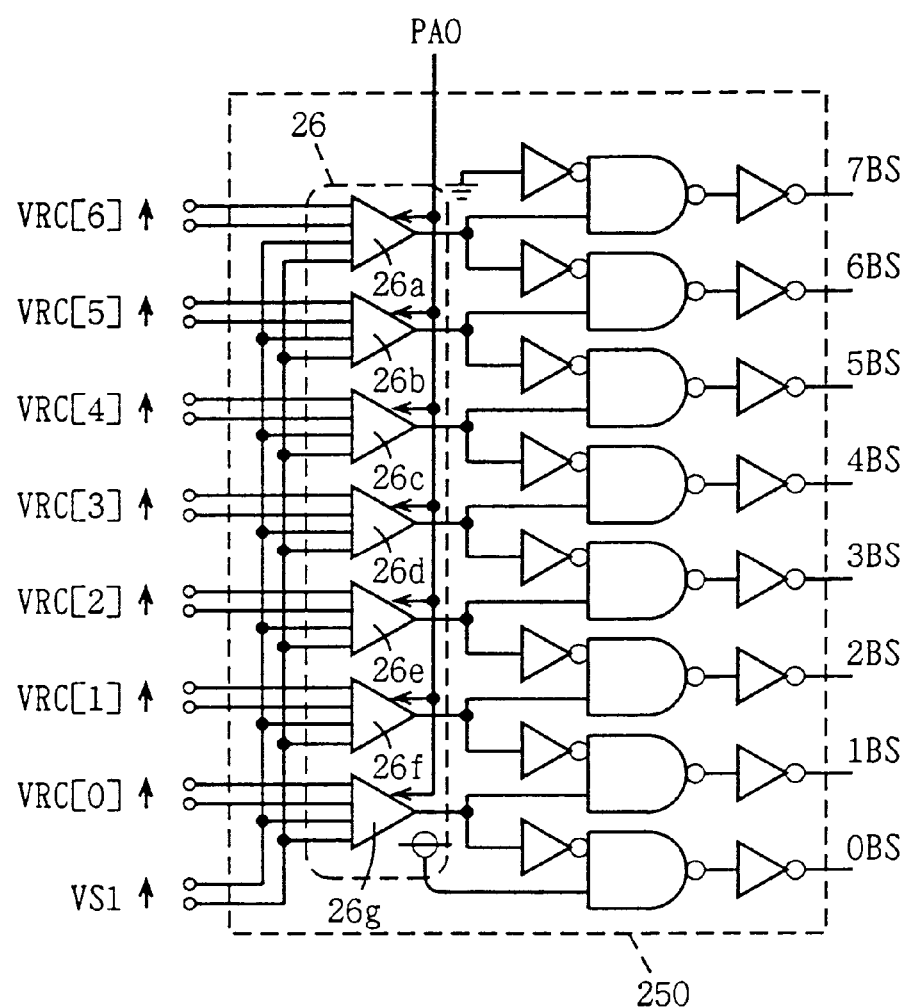
FIG. 8 shows a structure of a flash 3-bit A/D converter shown in FIG. 1.

FIG. 8 is a circuit diagram showing a structure of flash 3-bit A/D converter 250.

As shown in FIG. 8, flash 3-bit A/D converter 250 includes a comparing portion 26, which includes seven differential voltage comparators 26a–26g having the same structure and having commonly connected signal input terminals.

Comparing portion 26 compares input voltage VS with comparison reference voltages VRC[0]–VRC[6], and results of the comparison are sent as digital signals 0BS–7BS from flash 3-bit A/D converter 250 to encoder/latch circuit 31.

For example, when input voltage VS is smaller than comparison reference voltage VRC[0], 3 bits of 000 (i.e., 0 in decimal notation) are output as digital signal 0BS.

Likewise, when input voltage VS is larger than comparison reference voltage VRC[0] and smaller than comparison reference voltage VRC[1], 3 bits of 001 (i.e., 1 in decimal notation) is output as digital signal 1BS. When input voltage VS is larger than comparison reference voltage VRC[5] and smaller than comparison reference voltage VRC[6], 110 (i.e., 6 in decimal notation) is output as digital signal 6BS. When input voltage VS is larger than comparison reference voltage VRC[6], 111 (i.e., 7 in decimal notation) is output as digital signal 7BS. Other digital signals 2BS–5BS are also output in a similar manner.

Figure 9:
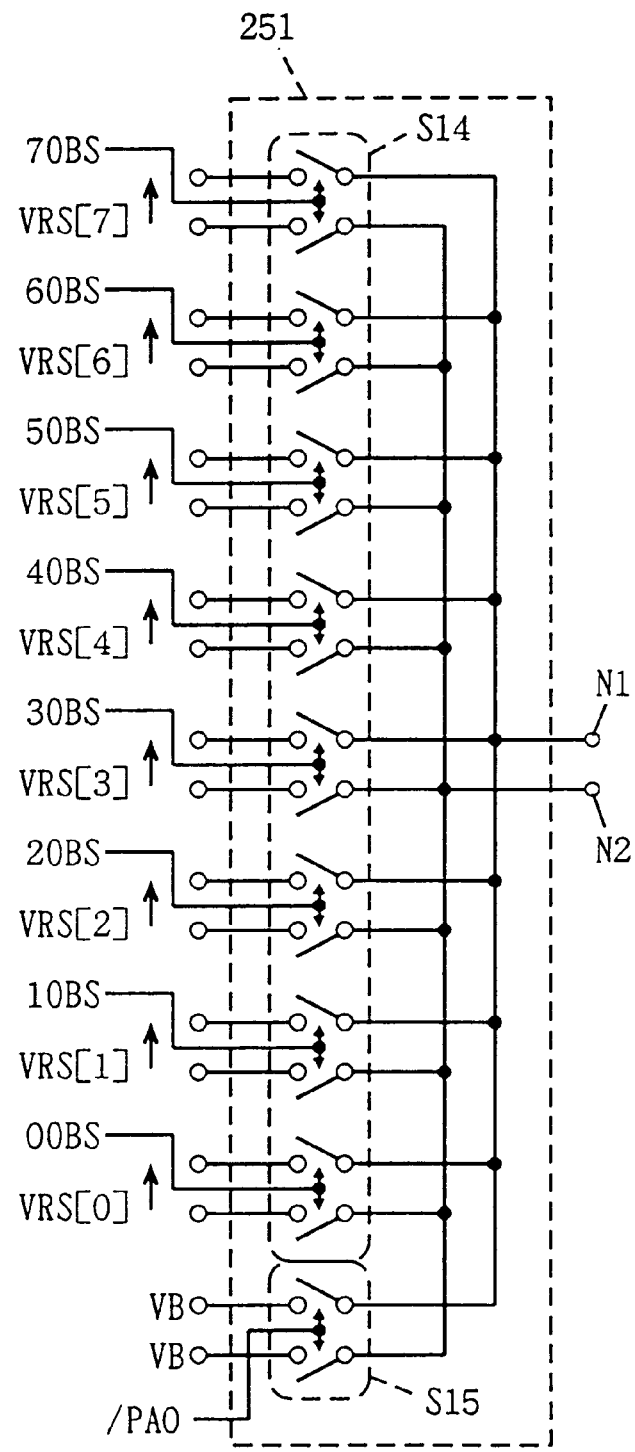
FIG. 9 shows a structure of a 3-bit D/A converter shown in FIG. 1.

FIG. 9 is a circuit diagram showing a structure of 3-bit D/A converter 251. As shown in FIG. 9, 3-bit D/A converter 251 includes a comparison voltage selecting portion S14 for subtraction and a bias voltage selecting portion S15.

In a hold period (subtraction period) during which control signal PA0 is at H-level, 3-bit D/A converter 251 activates one of signals 00BS-70BS in accordance with digital signals 0BS–7BS issued from flash 3-bit A/D converter 250, and selectively outputs one of subtraction reference voltages VRS[0]–VRS[7] to nodes N1 and N2. In a sample period during which control signal PA0 is at L-level, a switch of bias voltage selecting portion S15 is turned on, and bias voltage VB (differential voltage 0) is issued to nodes N1 and N2.

Figure 10:
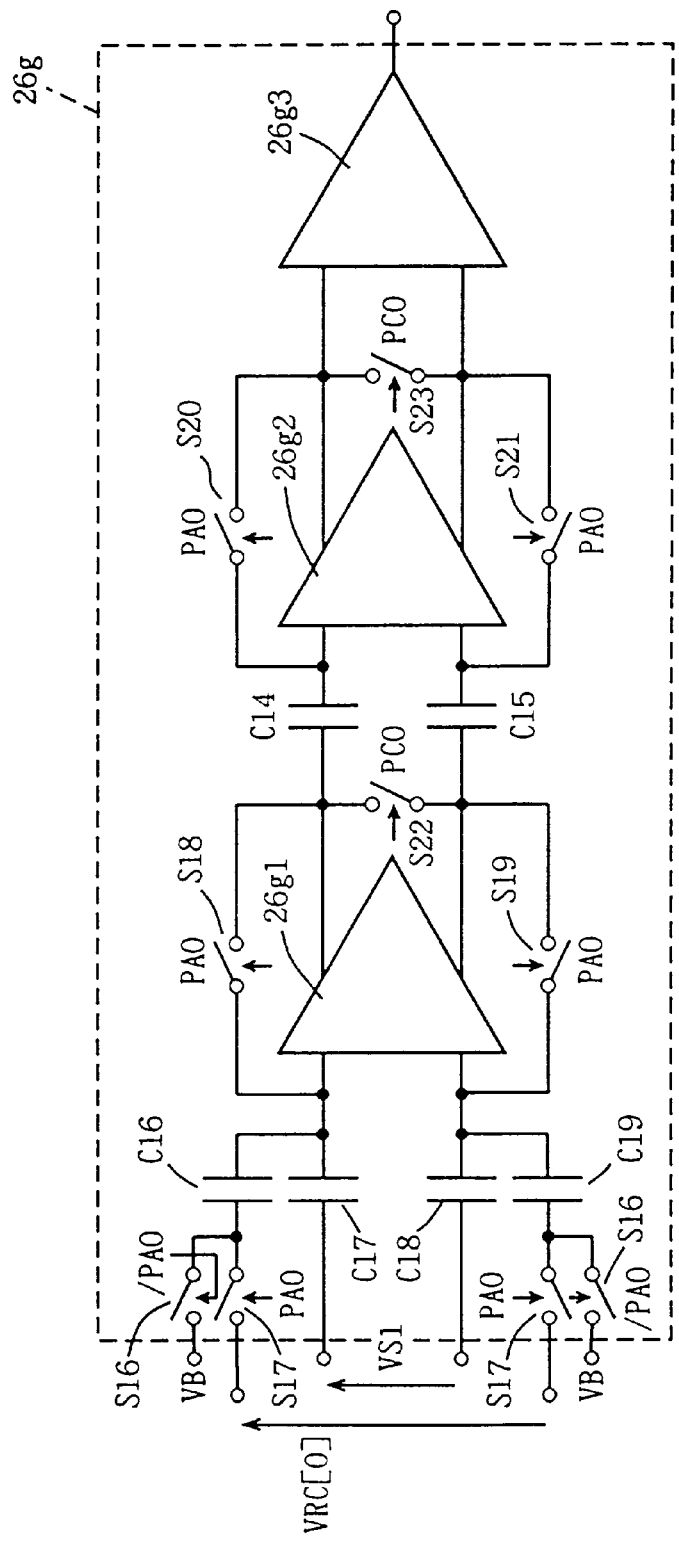
FIG. 10 shows a structure of a voltage comparator shown in FIG. 8.

FIG. 10 shows a structure of a differential voltage comparator 26g which is included in comparing portion 26 of flash A/D converter 250 shown in FIG. 8. As shown in FIG. 10, differential voltage comparator 26g includes switches S17, S18–S21 which are on during a first phase, i.e., a period for which control signal PA0 is at H-level, a switch S16 which is on during a second phase, i.e., a period for which control signal PA0 is at L-level, switches S22 and S23 which are responsive to control signal PC0 to be on only for a predetermined period in the first phase, capacitors C14 and C15, amplifiers 26g1 and 26g2, and a latch circuit 26g3. Control signal PC0 is produced by inputting signal PA0 to auto-zero voltage supply signal generating circuit 60 shown in FIG. 4.

Then, an operation of the A/D converter of the embodiment 1 will be described below with reference to FIGS. 3A–3F.

Figure 3:
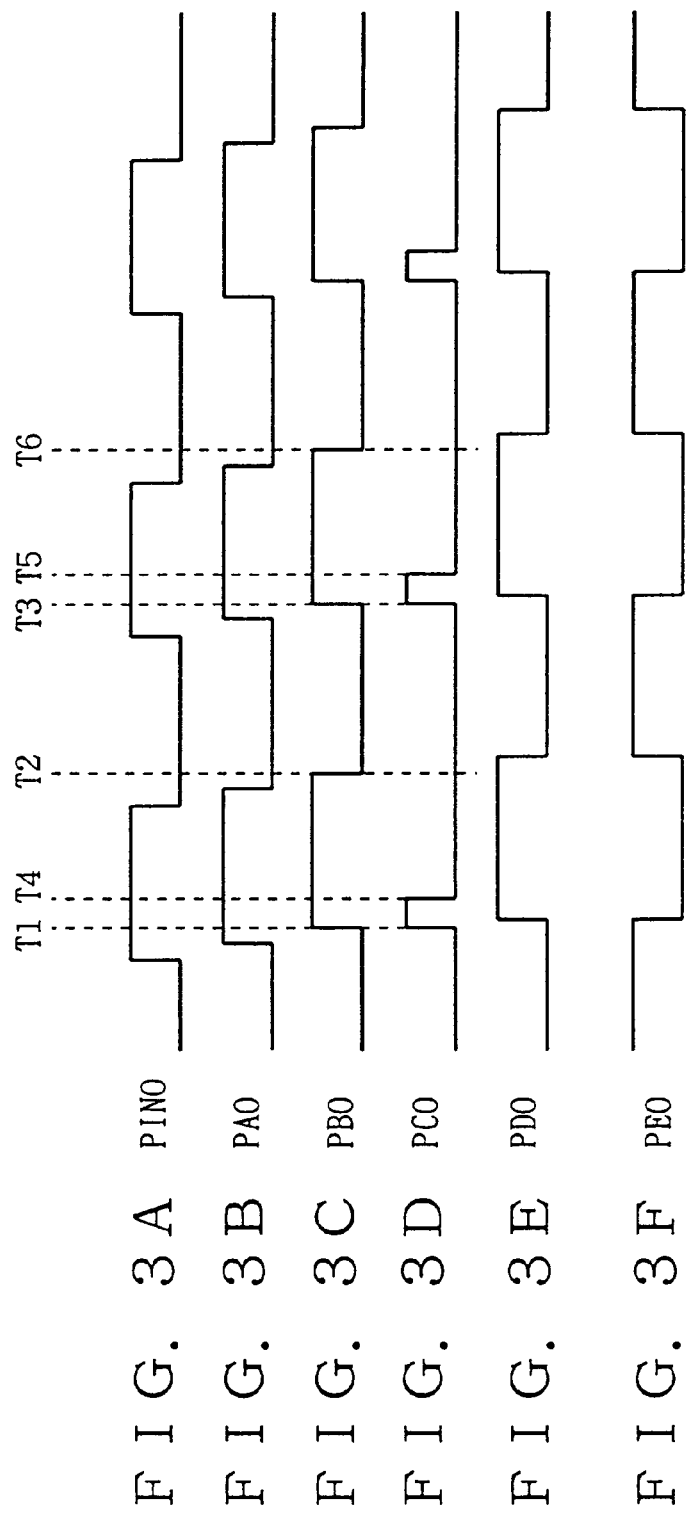
FIGS. 3A to 3F are timing charts showing an operation of an A/D converter shown in FIG. 1.

For a period between T1 and T2 during which control signal PB0 shown in FIG. 3C is at H-level, switch S8 is on, and bias voltage VB is applied to differential input terminals of amplifier 300. Thereby, an output offset voltage is supplied to differential output terminals of amplifier 300. As shown in FIG. 3D, switch S9 is turned on by control signal PC0, which attains H-level only for predetermined initial periods between T1 and T4 and between T3 and T5 in periods between T1 and T2 and between T3 and T6 during which control signal PB0 is at H-level, respectively. Thereby, differential output terminals of amplifier 30 are short-circuited for the predetermined periods T1–T4 and T3–T5.

The output offset voltage always forms a center in the differential outputs, and can be obtained rapidly by temporarily short-circuiting the differential output terminals.

Control signal PC0 is produced based on control signal PB0 by the circuit shown in FIG. 4. In this case, the threshold of inverter 605 can be changed by adjusting a size ratio between N- and P-channel transistors included in inverter 605, and thereby a pulse width of control signal PC0 can be adjusted.

According to the structure shown in FIG. 6, as described above, bias voltage VB is applied to the input terminals of amplifier 300 at the same timing as short-circuiting of the output terminals of amplifier 300, so that further increase in speed can be expected.

Switches S6 and S7 are on while control signal PD0 shown in FIG. 3E is at H-level, so that voltages VIN and VB are sampled as differential voltages in capacitors C1 and C2.

For a period from time T2 to T3 during which control signal PB0 shown in FIG. 3C is at L-level, switch S8 is off. For a period during which control signal PD0 shown in FIG. 3E is at L-level, switches S6 and S7 are off, and control signal PE0 shown in FIG. 3F is at H-level, so that switches S4 and S5 are turned on. Thereby, sample-hold circuit 30 attains a hold state, and amplifier 300 outputs differential voltage VS1.

This differential voltage VS1 is supplied to flash 3-bit A/D converter 250, and is compared with comparison reference voltages VRC[0]–VRC[6] supplied from ladder resistor 23.

This comparison was performed by differential voltage comparators 26a–26g included in comparing portion 26 shown in FIG. 8. An operation of differential voltage comparator 26g will be described below.

In the first phase, switches S17–S21 are on, and switch S16 is off. Differential voltage VS1 forms an output offset voltage of amplifier 300. At the moment of termination of the first phase, i.e., at the moment switches S17, S18–S21 are turned off, the output offset voltage of amplifier 300 and comparison reference voltage VRC[0] are sampled.

In the first phase, differential input and output terminals of each of amplifiers 26g1 and 26g2 are short-circuited, and amplifiers 26g1 and 26g2 issue auto-zero voltages (offset voltages). The auto-zero voltages of amplifiers 26g1 and 26g2 are applied to capacitors C14 and C15, respectively, so that deterioration of comparison accuracy due to difference in auto-zero voltages of amplifiers 26g1 and 26g2 is prevented. For faster output of the auto-zero voltages from amplifiers 26g1 and 26g2, control signal PC0 which attains H-level for a predetermined initial period in the first phase is supplied for turning on switches S22 and S23.

The differential output terminals in the first phase can return fast to the auto-zero voltage by turning on switches S22 and S23 and thereby short-circuiting the differential output terminals of amplifiers 26g1 and 26g2, because their initial value is equal to a value of voltage which is prepared by comparing differential voltage VS1 with comparison reference voltage VRC[0] and amplifying the same. Since the auto-zero voltage is peculiar to each amplifier, switches S22 and S23 are turned on only for a predetermined initial period in the first phase, and then will be turned off.

In the subsequent second phase, switch S16 is turned on, and switches S17, S18–S21 are turned off. In this state, a voltage held by sample-hold circuit 30 is supplied as differential voltage VS1. Therefore, the offset voltage of amplifier 300 sampled in the first phase is removed, and the true signal voltage is applied to comparator 26g1. Bias voltage VB is applied to capacitors C16 and C19, so that the true signal voltage is compared with comparison reference voltage VRC[0].

In response to the above operation, 3-bit D/A converter 251 shown in FIG. 9 operates as follows. In the first phase of 3-bit D/A converter 251, one of digital signals 00BS–70BS is activated in response to a result of comparison in the second phase, and one of subtraction reference voltages VRS[0]–VRS[7] is output to output nodes N1 and N2.

In the second phase of 3-bit D/A converter 251, a control signal /PA0 turns on the switch of bias voltage selecting portion S15, so that bias voltage VB is supplied to output nodes N1 and N2. Thus, the differential voltage of 0 is output.

As described above, 3-bit D/A converter 251 issues one of subtraction reference voltages VRS[0]–VRS[7] to subtracter circuit 40 in the first phase, and also issues the differential voltage of 0 to the subtracter circuit 40 in the second phase.

The subtracter circuit 40 performs sampling with a phase opposite to sample-hold circuit 30, i.e., in the second phase, and subtracts the voltage value, which is supplied from 3-bit D/A converter 251, from the output voltage value of sample-hold circuit 30 in the first phase.

Thus, in the first phase, the offset voltage of amplifier 300 is canceled and the hold state is attained, so that subtraction is performed. The result of this subtraction is multiplied eight-fold by amplifier 400 to produce differential voltage VS2 which is supplied to flash 3-bit A/D converter 250 included in A/D converting stage 54, because the reference voltage produced by ladder resistor 23 is used as a common reference for comparison.

Flash 3-bit A/D converter 250 and 3-bit D/A converter 251 included in A/D converting stage 54 are similar to flash 3-bit A/D converter 250 and 3-bit D/A converter 251 included in A/D converting stage 52, but operate with phases opposite to them, respectively.

Subtracter circuit 50 and flash 3-bit A/D converter 250 included in A/D converting stage 56 operate with phases opposite to those of subtracter circuit 40 included in A/D converting stage 52 and flash 3-bit A/D converter 50 included in A/D converting stage 54 (i.e., with the same phases as sample-hold circuit 30 and flash 3-bit A/D converter 250 included in A/D converting stage 52), respectively.

Flash 3-bit A/D converter 250 included in A/D converting stage 52 issues a digital signal for higher 3 bits, flash 3-bit A/D converter 250 included in A/D converting stage 54 issues a digital signal for middle 3 bits, and flash 3-bit A/D converter 250 included in A/D converting stage 56 issues a digital signal for lower 3 bits. The digital signals for these bits are supplied to encoder/latch circuit 31, which outputs a digital signal of 9 bits in total.

[Embodiment 2]

Although the A/D converter of the embodiment 1 described above is of a differential type, which is employed for improving a resistance against noises, the A/D converter according to the invention is not restricted to the differential type.

Figure 11:
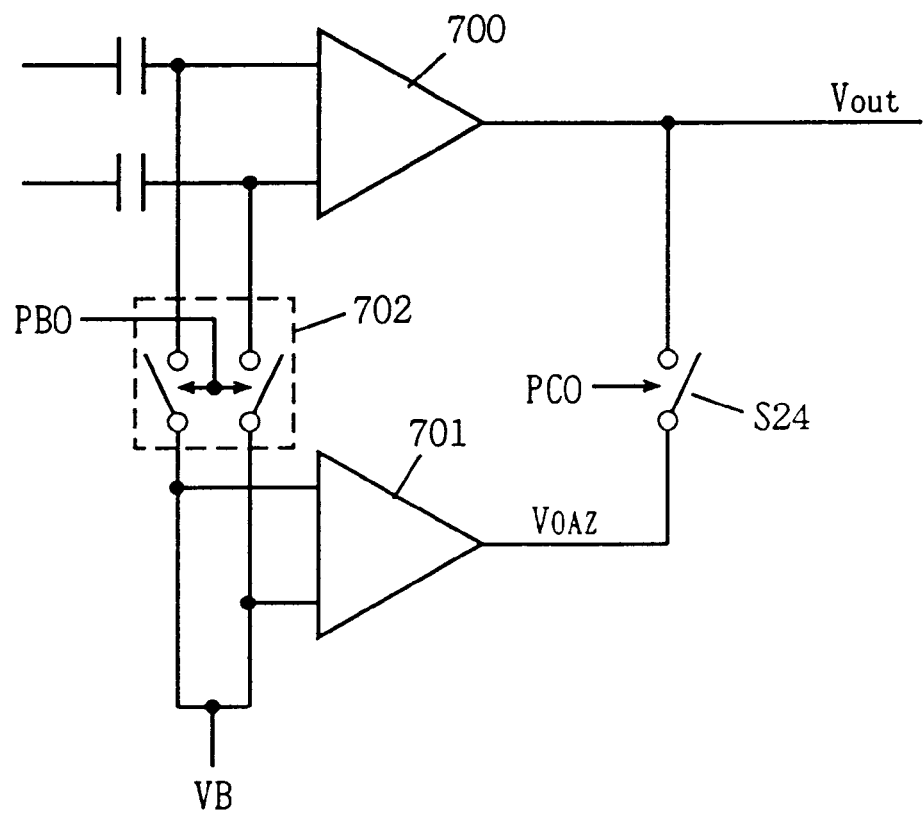
FIG. 11 shows an A/D converter of an embodiment 2 of the invention.

More specifically, an amplifier 700 shown in FIG. 11 may be employed in place of each of amplifiers 300, 400, 500, 26g1 and 26g2 included in sample-hold circuit 30, subtracter circuits 40 and 50, voltage comparators 26a–26g of flash 3-bit A/D converter 250 in differential pipeline A/D converter shown in FIG. 1.

The output terminal of amplifier 700 is connected through a switch S24, which is controlled by control signal PC0, to an output node of an amplifier 701 which receives bias voltage VB and has the same circuit structure and the same circuit constant as the amplifier 700. Since amplifier 701 is always supplied with bias voltage VB, it always outputs an auto-zero voltage $V_{OAZ}$.

Amplifier 700 is supplied on its input terminals with bias voltage VB in response to turn-on of a switch 702 controlled by control signal PB0.

An operation of amplifier 700 will be described below with reference to timing charts of FIGS. 12A to 12C. Control signal PC0 is produced, e.g., by a circuit shown in FIG. 4 based on control signal PB0.

Figure 12:
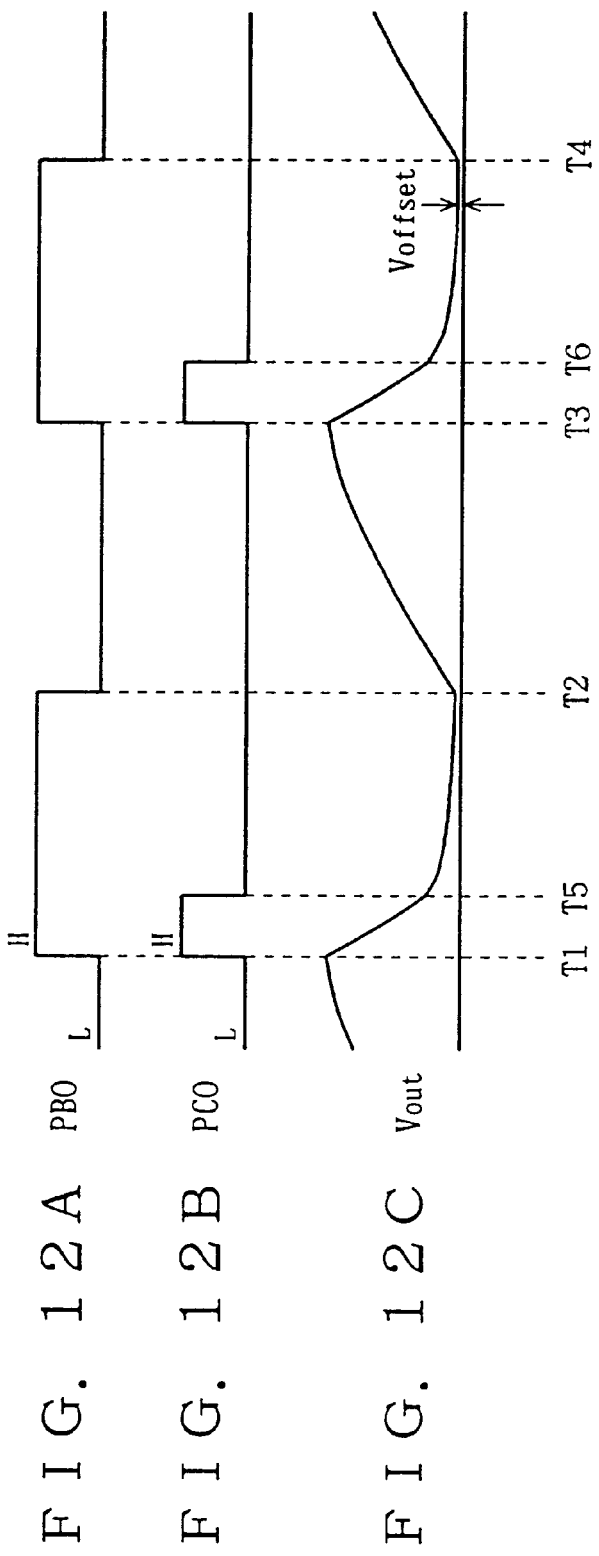
FIGS. 12A to 12C are timing charts showing an operation of a circuit shown in FIG. 11.
Figure 13:
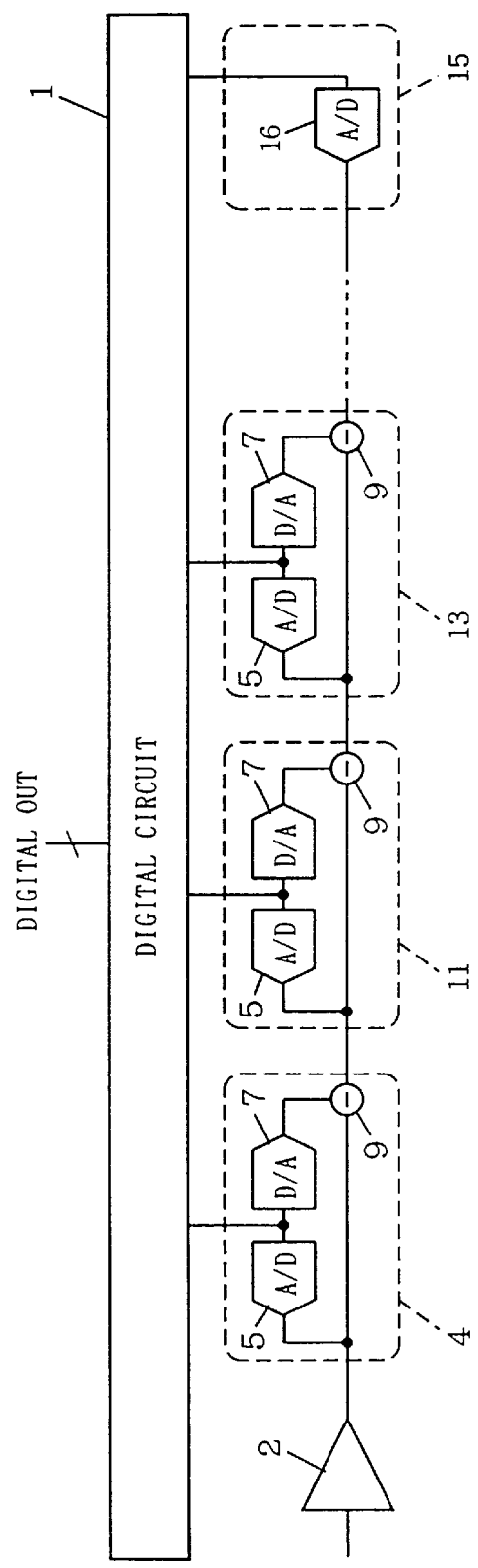
FIG. 13 shows a whole structure of a pipeline A/D converter in the prior art.
Figure 14:
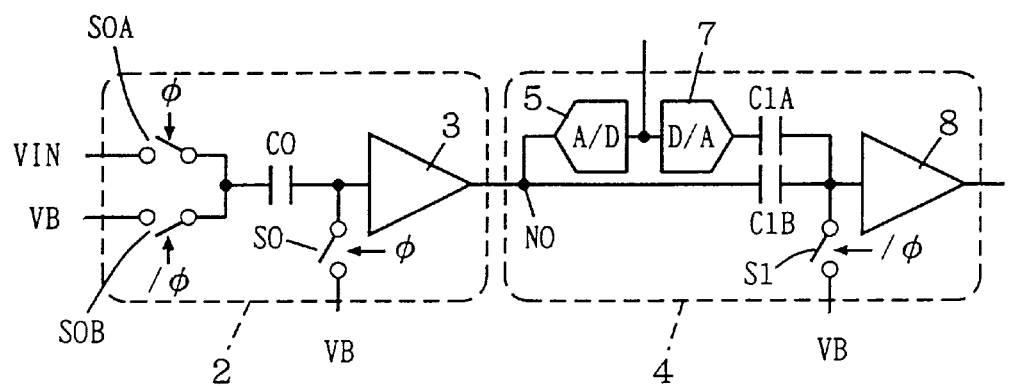
FIG. 14 shows a sample-hold circuit shown in FIG. 13 and a structure of an A/D sub-converter connected thereto.
Figure 15:
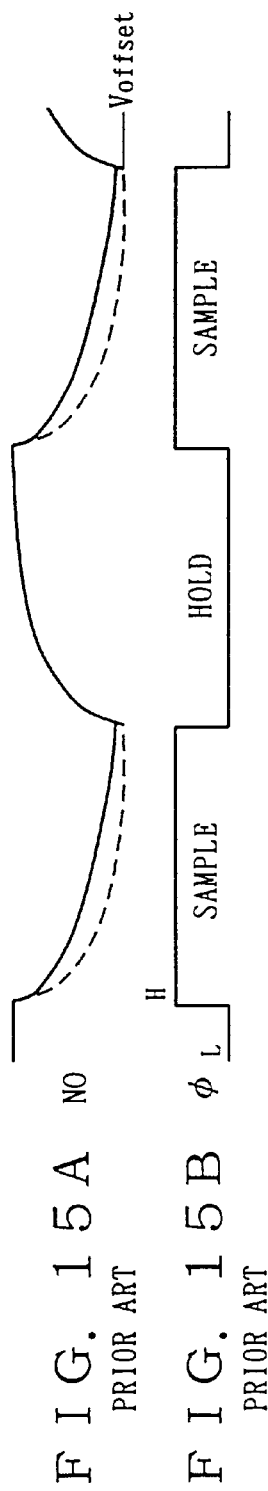
FIGS. 15A and 15B are timing charts showing an operation of a circuit shown in FIG. 14.
Figure 16:
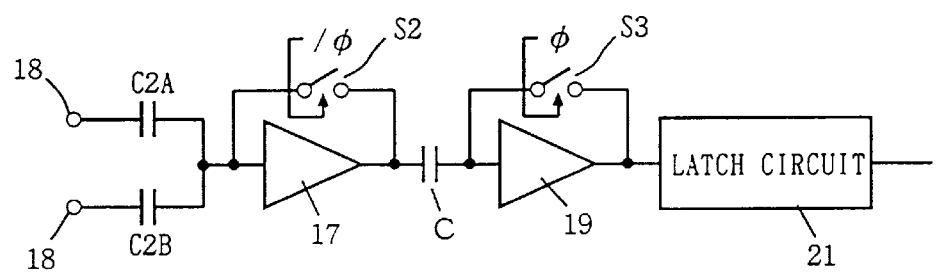
FIG. 16 shows a structure of a conventional voltage comparator included in a flash A/D converter shown in FIG. 13.

As shown in FIGS. 12A to 12C, amplifier 700 is supplied with bias voltage VB and therefore issues an offset voltage for periods from T1 to T2 and from T3 to T4 during which control signal PB0 is at H-level. Switch S24 is supplied with control signal PC0 which is at H-level only for predetermined periods from T1 to T5 and from T3 to T6 during which control signal PB0 is at H-level, and therefore is on only for these periods from T1 to T5 and from T3 to T6. Thereby, an auto-zero voltage of amplifier 701 is supplied to an output terminal of amplifier 700. Therefore, a magnitude of output voltage $V_{out}$ of amplifier 700 changes as shown in FIG. 12C, and therefore offset voltage $V_{offset}$ can be fast obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog/digital converter comprising:

data holding means for taking in first analog data for a first period and holding the same for a second period;

a plurality of analog/digital converting stages connected in series to said data holding means; and latching means for latching digital data issued from each of said analog/digital converting stages, wherein one of said analog/digital converting stages connected to said data holding means includes:

analog/digital converting means for converting second analog data supplied from said data holding means into digital data and outputting the same to said latching means, digital/analog converting means connected to said analog/digital converting means for converting said digital data into third analog data, subtracting means for subtracting said third analog data from said second analog data and thereby outputting result data of the subtraction, first amplifying means connected to said subtracting means for receiving a first bias voltage for said second period and amplifying said result data of the subtraction supplied from said subtracting means for said first period, and first voltage supply means for supplying a first auto-zero voltage to an output terminal of said first amplifying means only for a predetermined initial period in said second period.

2. The analog/digital converter according to claim 1, wherein said first voltage supplying means includes third amplifying means having the same circuit structure and the same circuit constant as said first amplifying means and being operable to output said first auto-zero voltage in response to reception of said first bias voltage.

3. The analog/digital converter according to claim 1, wherein said data holding means includes:

second amplifying means for receiving a second bias voltage for said first period and receiving said first analog data for said second period; and second voltage supply means for supplying a second auto-zero voltage to an output terminal of said second amplifying means only for a predetermined initial period in said first period.

4. The analog/digital converter according to claim 3, further comprising:

control signal producing means for producing and supplying to said data holding means a control signal determining said first period in response to an input clock signal; and auto-zero voltage supply signal producing means for producing and supplying to said second voltage supply means an auto-zero voltage supply signal determining a timing of supply of said second auto-zero voltage by said second voltage supply means.

5. The analog/digital converter according to claim 4, wherein said auto-zero voltage supply signal producing means includes:

a capacitor supplied on one of its nodes with said control signal, a ground node, and a resistor element connected between the other node of said capacitor and said ground node.

6. The analog/digital converter according to claim 4, wherein said auto-zero voltage supply signal producing means includes:

a first inverter supplied with said control signal;

a capacitor connected at one of its nodes to an output terminal of said first inverter, a power supply node, a resistor element connected between said power supply node and the other node of said capacitor, and a second inverter connected to the other node of said capacitor.

7. The analog/digital converter according to claim 3, further comprising:

bias voltage supply means connected to an input terminal of said second amplifying means for supplying said second bias voltage to the input terminal of said second amplifying means at the same timing as supply of said second auto-zero voltage from said second voltage supply means to an output terminal of said second amplifying means.

8. The analog/digital converter according to claim 3, wherein said data holding means differentially receives said second bias voltage and said first analog data, and differentially outputs said second analog data, and said subtracting means differentially receives said second analog data and said third analog data, and differentially outputs said result data of the subtraction.

9. An analog/digital converter comprising:

data holding means for differentially receiving first analog data for a first period and holding the same for a second period;

a plurality of analog/digital converting stages connected in series to said data holding means; and latching means for latching digital data issued from each of said analog/digital converting stages, wherein one of said analog/digital converting stages connected to said data holding means includes:

analog/digital converting means for converting second analog data differentially supplied from said data holding means into digital data and outputting the same to said latching means, digital/analog converting means connected to said analog/digital converting means for converting said digital data into third analog data, subtracting means for subtracting said third analog data from said second analog data and thereby outputting result data of the subtraction, first amplifying means connected to said subtracting means for receiving a first bias voltage for said second period and amplifying said result data of the subtraction supplied from said subtracting means for said first period, and first switching means for short-circuiting differential output terminals of said first amplifying means only for a predetermined initial period in said second period.

10. The analog/digital converter according to claim 9, wherein said data holding means includes:

second amplifying means supplied with a second bias voltage for said first period and supplied with said first analog data for said second period; and second switching means for short-circuiting differential output terminals of said second amplifying means only for a predetermined initial period in said first period.

11. A voltage comparator for receiving data for a data receiving period and comparing said data with a reference voltage to output a result of the comparison for a data comparing period, comprising:

amplifying means for comparing said data with said reference voltage and amplifying the result of the comparison; and voltage supply means for supplying an auto-zero voltage to an output terminal of said amplifying means only for a predetermined initial period in said data receiving period.

* * * * *